United States Patent [19]
Kohno

[11] Patent Number: 5,341,015
[45] Date of Patent: Aug. 23, 1994

[54] SEMICONDUCTOR DEVICE WITH REDUCED STRESS ON GATE ELECTRODE

[75] Inventor: Yasutaka Kohno, Itami, Japan

[73] Assignee: Mitsubishi Denki Kabushiki Kaisha, Tokyo, Japan

[21] Appl. No.: 625,798

[22] Filed: Dec. 11, 1990

Related U.S. Application Data

[63] Continuation of Ser. No. 449,789, Dec. 13, 1989, abandoned.

[30] Foreign Application Priority Data

Mar. 29, 1989 [JP] Japan .................... 1-79254

[51] Int. Cl.$^5$ ............... H01L 29/80; H01L 29/84; H01L 29/04
[52] U.S. Cl. .................. 257/402; 257/327; 257/388; 257/412; 257/633
[58] Field of Search .............. 357/22, 26, 22 J, 22 H, 357/22 C, 60, 22 I, 22 H, 22 C; 257/327, 388, 402, 412, 633

[56] References Cited

U.S. PATENT DOCUMENTS

| | | | |
|---|---|---|---|
| 3,856,647 | 12/1974 | Blachman | 204/192 |
| 4,777,517 | 10/1988 | Onodera et al. | 357/60 |
| 4,791,471 | 12/1988 | Onodera et al. | 357/60 |
| 5,023,676 | 6/1991 | Tatsuta | 357/60 |

FOREIGN PATENT DOCUMENTS 0112657 7/1984 European Pat. Off. .
61-183961 8/1986 Japan .................. 204/192.17

OTHER PUBLICATIONS

"0.3—μm Advanced Saint FET's Having Asymmetric m+-Layers For Ultra-High-Frequency GaAs MMIC's", Enoki et al., IEEE Transactions on Electron Device, 1988, pp. 18–21.

Asbeck et al., "Piezoelectric Efects in . . . Characteristics", IEEE Transactions on Electron Devices, vol. ED-32, No. 11, 1985, 1377–1380.

Onodera et al., "Improvement in GaAs . . . Effect", IEEE Transactions on Electron Devices, vol. ED-32, No. 11, 1985, 2314–2318.

Schnell et al., "Compensating Piezoelectric . . . MESFETs", Japanese Journal of Applied Physics, vol. 26, No. 10, 1987, L1583–L1586.

*Primary Examiner*—Rolf Hille
*Assistant Examiner*—Mahshid Saadat
*Attorney, Agent, or Firm*—Leydig Voit & Mayer

[57] ABSTRACT

In a semiconductor device having a gate electrode and an insulating film covering the gate electrode on a compound semiconductor substrate, the vector sum of the stress in the gate metal and the stress produced by the insulating film on the gate electrode is zero. A production method of a semiconductor device includes producing a gate electrode having the same but opposite stress of an insulating film by sputtering under an adjusted gas pressure a target of WSi$_x$ and depositing an insulating film covering the gate electrode.

5 Claims, 8 Drawing Sheets

SEMICONDUCTOR DEVICE WITH REDUCED STRESS ON GATE ELECTRODE

This application is a continuation of application Ser. No. 07/449,789, filed Dec. 13, 1989, now abandoned.

FIELD OF THE INVENTION

The present invention relates to a semiconductor device and a production method therefor, and more particularly, to improving the gate direction dependence of the threshold voltage in a compound semiconductor field effect transistor.

BACKGROUND OF THE INVENTION

Figure 7:
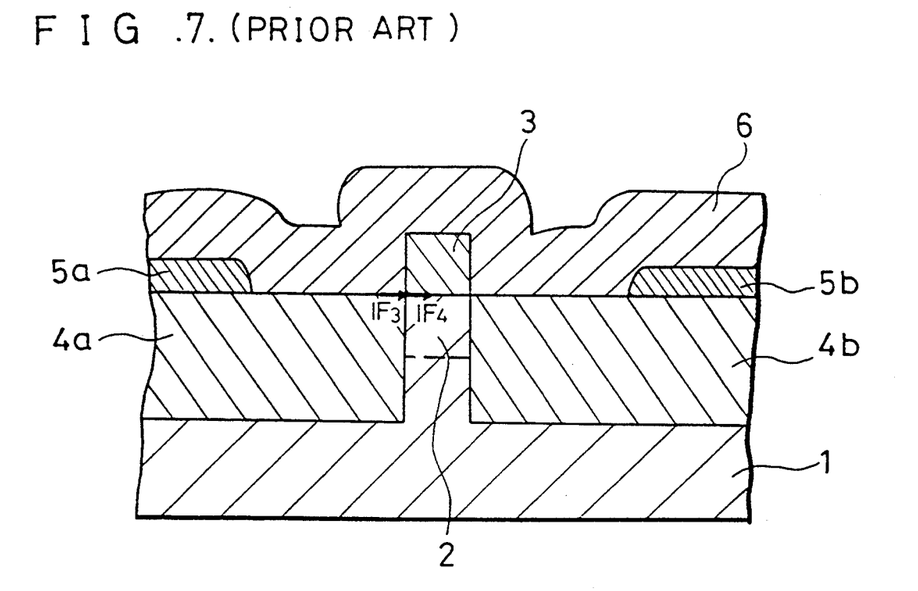
FIG. 7 is a cross-sectional side view showing a prior art semiconductor device.

FIG. 7 shows a prior art refractory metal self aligned gate FET. In FIG. 7, reference numeral 1 designates a semi-insulating GaAs substrate. An active layer 2 is disposed in a (100) GaAs substrate 1. A gate electrode 3 comprising tungsten silicide is disposed on the active layer 2. High dopant concentration layers 4a and 4b are disposed in the GaAs substrate 1. Ohmic electrodes 5a and 5b are disposed on the layers 4a and 4b, respectively. The reference character IF$_3$ designates compressive stress from the insulating film 6 applied to the end of gate electrode 3 and reference character IF$_4$ designates tensile stress in the tungsten silicide at the end of the gate electrode 3.

In this prior art example, a tensile stress F$_4$ caused by the tungsten silicide 3 and a compressive stress F$_3$ caused by the insulating film 6 are applied to the gate electrode 3. When such stresses are generated at the end of gate electrode 3, the semi-insulating GaAs substrate 1 is distorted below the gate electrode 3, and piezoelectric charges are generated in the substrate directly below the gate electrode 3. A distribution of positive and negative charges is generated as is generally known.

Figure 10:
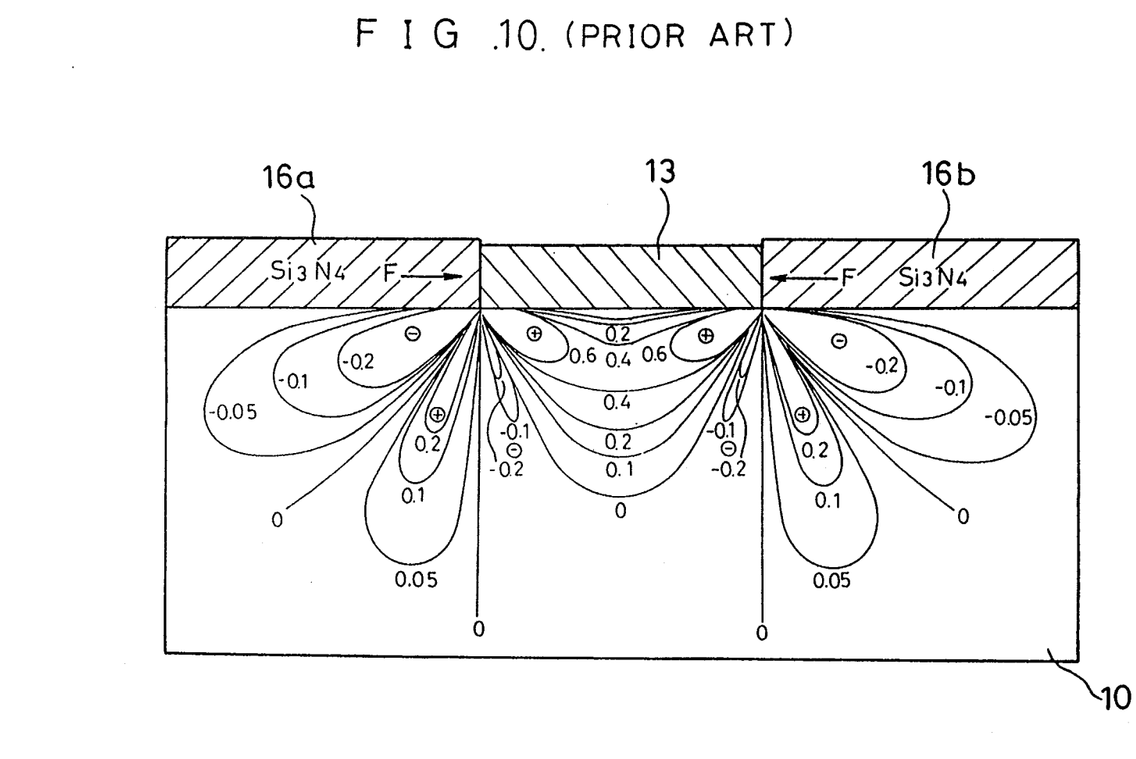
FIG. 10 is a diagram showing the distribution of piezoelectric charges generated in the substrate due to the stress of an insulating film disposed on the semi-insulating GaAs substrate.

FIG. 10 shows the distribution of piezoelectric charges shown in IEEE Transactions on Electron Devices, Vol. ED-31, No.10.1984. In FIG. 10, reference numeral 10 designates a semi-insulating GaAs substrate, reference numeral 13 designates a gate electrode, reference numerals 16a and 16b designate insulating films (Si$_3$N$_4$), and reference character F designates a stress applied to the end of gate electrode 13 from the insulating films 16a and 16b. When the stress F is generated, distortion occurs in the substrate 10. Herein, when a compound semiconductor such as a semi-insulating GaAs substrate is used for the substrate, Ga and As atoms produce a polarization due to the distortion and the distribution of piezoelectric charges vary dependent on the crystalline direction in the substrate. For example, when stresses as shown in FIG. 7 are generated at the end of gate electrode 3, the positive charges increase in the [011] direction of GaAs with a (100) crystal face, while negative charges increase in the [0$\bar{1}$1] direction thereof, and the piezoelectric charges are not generated in the [010] direction.

Figure 8:
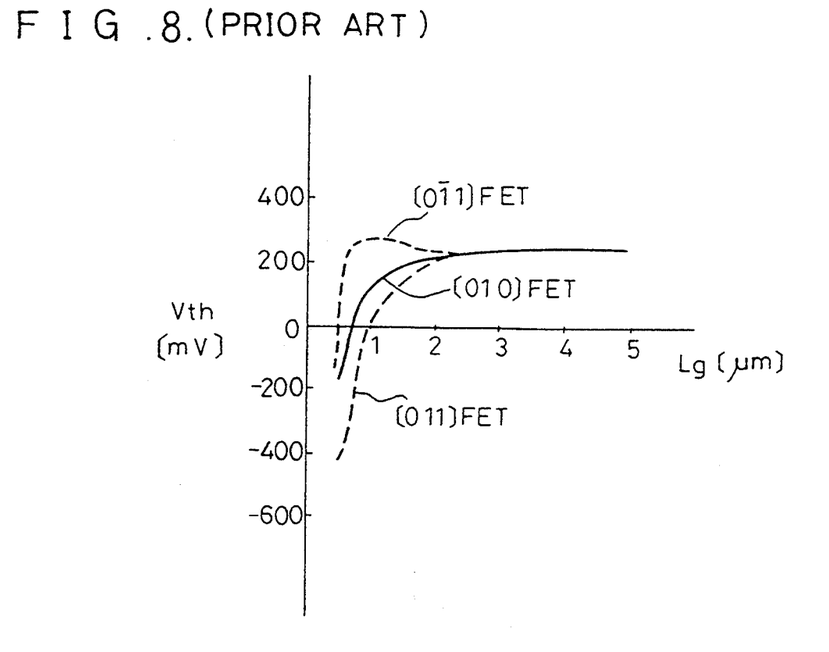
FIG. 8 is a diagram showing the gate direction dependence of the short channel effect of the prior art semiconductor device.

It is generally known that as the gate length is shortened, the short channel effect arises in which the threshold voltage is shifted toward the negative side. When the distribution of piezoelectric charges arising due to the stress applied to the substrate varies with the crystalline direction of the substrate, as in compound semiconductors such as GaAs as discussed above, the short channel effect varies dependent on the direction of the gate electrode 3 of the field effect transistor which is produced on the substrate. FIG. 8 shows the gate direction dependence of the short channel effect where the field effect transistor has the stresses as shown in FIG. 7. As shown in the figure, the controllability and the variation of the V$_{th}$ are stable in an FET having a [010] gate direction, while the V$_{th}$ shift due to the short channel effect is large in the FET having a [011] gate direction. Furthermore, the $\partial V_{th}/\partial L_g$ at the submicron region is unfavorably large in an FET having a [0$\bar{1}$0] gate direction.

Figures 9A, 9B:
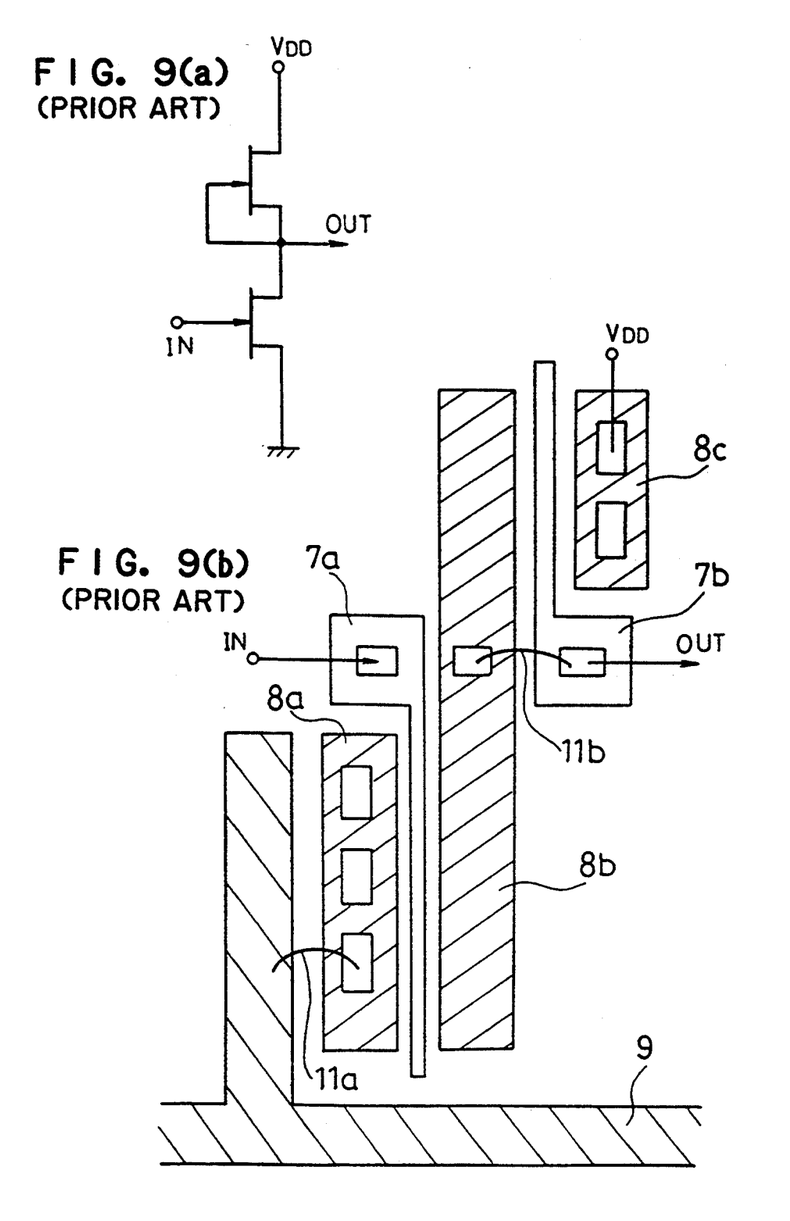
FIGS. 9(a) and 9(b) are circuit diagrams of a DCFL circuit and a pattern diagram thereof according to a prior art semiconductor device.

FIGS. 9(a) and 9(b) show a circuit diagram and a plan view of a pattern arrangement in a case where an integrated circuit is constructed using the field effect transistors shown in FIG. 7. FIG. 9(a) shows a circuit construction for DCFL (Direct Coupled FET Logic) and FIG. 9b) shows a pattern diagram thereof.

In FIG. 9(b), reference numerals 7a and 7b designate gate electrode pads, reference numerals 8a, 8b, 8c designate ohmic contact electrodes, and reference numeral 9 designates ground. As shown in FIG. 9b), the ohmic electrodes 8a and 8b function as a source electrode and a drain electrode associated with the gate electrode 7a, and the ohmic electrodes 8b and 8c function as a source electrode and a drain electrode associated with the gate electrode 7b, and the ohmic electrode 8b and gate electrode 7b, and the ohmic electrode wiring 8a and ground 9 are connected by wire bondings 11b and 11a, respectively. When an integrated circuit is constructed including the field effect transistors of FIG. 7, the direction of gate electrode 3 which is disposed on the semi-insulating GaAs substrate 1 should be the same direction in all cases. As shown in FIG. 9b) from the crystal direction dependence of the piezoelectric charges distribution generated directly below the gate electrode 3 of the field effect transistor, the gate electrode wiring 7b should be patterned in the same direction as the gate electrode wiring 7a, thereby resulting in a rectangular pattern configuration.

The prior art semiconductor device of such a construction has following problems because of the crystal direction dependence of piezoelectric charges generated below the gate electrode 3.

1) When an FET having [011] gate direction is adopted, the V$_{th}$ shift due to the short channel effect is large and the controllability of V$_{th}$ is low.

2) When an FET of [0$\bar{1}$1] gate direction is adopted, the $\partial V_{th}/\partial L_g$ for a submicron gate length is increased and the V$_{th}$ is likely to be affected by variations in gate length, increasing the variation of V$_{th}$.

3) When an FET having [010] direction is adopted, the controllability and variation of V$_{th}$ are improved but there is crystal breakage in this direction, thereby requiring another device in producing a mask. Further, the chip size is unfavorably increased, thereby resulting in lowering of the yield.

In this way, because the threshold voltage varies with the gate direction, FETs constituting an integrated circuit are required to have the same gate direction and the degree of freedom in design is reduced, limiting the reduction of chip area.

SUMMARY OF THE INVENTION

It is an object of the present invention to provide an FET semiconductor device providing a predetermined threshold voltage with high reproducibility, at high uniformity, and producing a small sized integrated circuit.

It is a further object of the present invention to provide a method of producing such a semiconductor device.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, in a semiconductor device in which a gate electrode is disposed on a compound semiconductor substrate, the stress of gate metal concentrated at the end of gate electrode and the stress applied to the end of gate electrode by an insulating film provided at the entire surface of substrate covering the gate electrode are in a relationship that the vector sum of them is equal to zero.

According to another aspect of the present invention, sputtering in a gas pressure of 3 to 20 m Torr using a target of $WSi_{0.2}$ to $WSi_{0.8}$ produces tungsten silicide having the same stress as that of the insulating film which will be deposited later, covering the gate electrode.

Since both the stress of gate metal and the stress of insulating film exerted on the gate electrode have the same values, the stresses cancel with each other. Further, the generation of piezoelectric charges is prevented and the short channel effect of the field effect transistor is effectively suppressed and no gate direction dependence of $V_{th}$ is observed. Furthermore, since no gate direction dependence is observed, integrated circuits can be produced including field effect transistors having gates arranged in arbitrary directions.

BRIEF DESCRIPTION OF THE DRAWINGS

FIGS. 4 (a) and 4 (b) are a circuit diagram of a DCFL circuit and a pattern diagram showing a pattern arrangement thereof according to the embodiment of the present invention;

FIGS. 5 (a) to 5 (d) are cross-sectional views showing a production method of a semiconductor device according to the embodiment of the present invention;

DETAILED DESCRIPTION OF THE PREFERRED EMBODIMENTS

An embodiment of the present invention will be described in detail with reference to the drawings.

Figure 1:
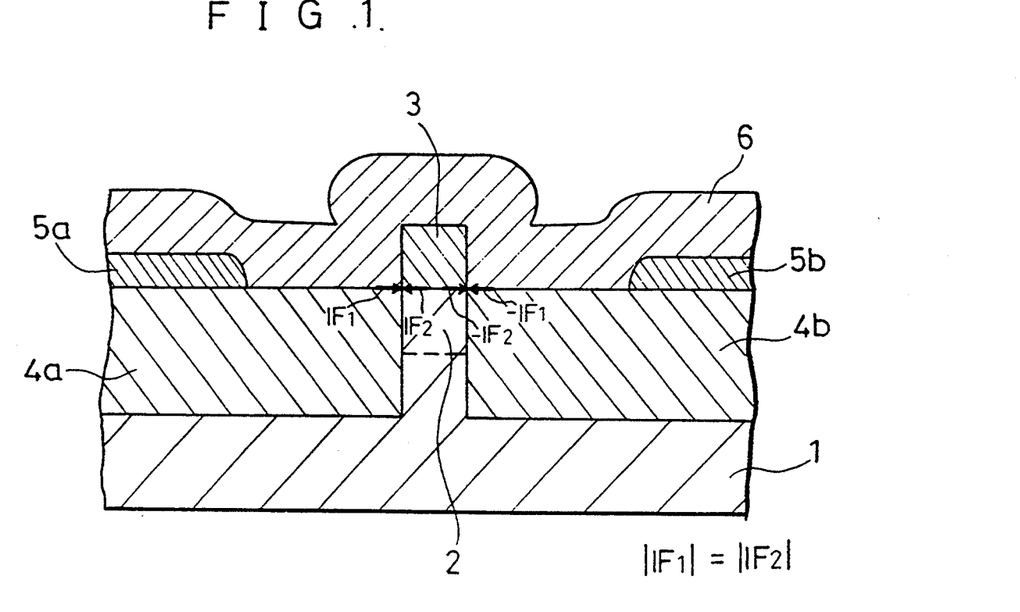
FIG. 1 is a cross-sectional view of a semiconductor device according to an embodiment of the present invention.

FIG. 1 shows a cross-sectional view of a semiconductor device according to an embodiment of the present invention. The structure of the FET is the same as that of FIG. 7 except, as explained below, for the relationship between the stresses in the gate 3 and insulating film 6, and the same reference numerals designate the same or corresponding elements. FIG. 5 (a) to 5 (d) are cross-sectional views showing a production method for producing the semiconductor device of FIG. 1.

Next, the production method of this embodiment device will be described.

First of all, prior to the production process of FIGS. 5(a)–5(d), the stress of insulating film 6 which is concentrated at the gate electrode 3 is measured. This stress is from the bending of the insulating film 6 relative to the state where no pattern is present on a (100) GaAs substrate 1 as shown in FIGS. 6(b) and 6(c). In other words, when a convex type bending occurs as shown in FIG. 6(b), it has compressive stress against the substrate 1. When a concave type bending arises as shown in FIG. 6(c), it applies a tensile stress to the substrate 1. The amount of the stress is determined by the degree of the bending of the substrate. Furthermore, the stress can be determined by the X ray diffraction.

This method is one for measuring the distortion arising in patterning the insulating film on a (100) GaAs substrate, and it is obtained from the wavelength shift measured in the X ray diffraction.

Figure 3:
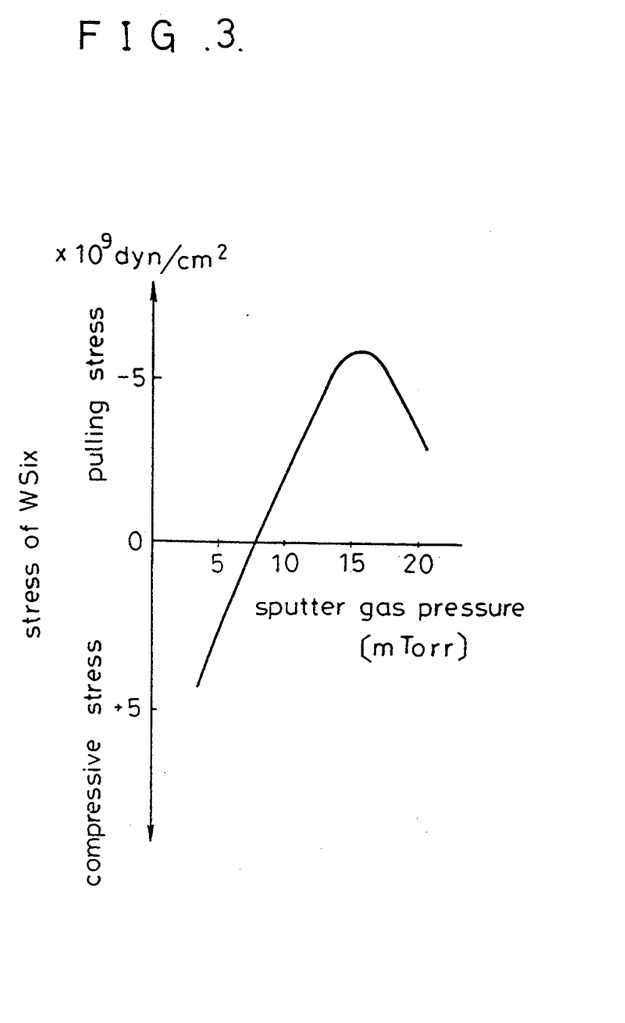
FIG. 3 is a diagram showing the sputtering gas pressure dependence of the stress of tungsten silicide.

The stress of insulating film 6 which will be produced at a later process is previously measured in this way Si+ ions are implanted at 50 KeV and $1.5 \times 10^{12}$ cm$^{-2}$ and annealing is conducted to produce an active layer 2 to a thickness of 600 to 1000 angstroms. Thereafter, a $WSi_x$ (x=0.2 to 0.8) film is deposited on the entire surface of (100) crystal face of semi-insulating GaAs substrate 1 by sputtering to a thickness of 3000 angstroms. A gate electrode 3 having a desired gate length of 1 to 0.5 microns is produced by photolithography. Herein, in the process of depositing the $WSi_x$ film, the stress of $WSi_x$ film 3 after annealing which is deposited with an applied power of 450 W and sputtering pressure of 3 to 20 m Torr using target of $WSi_{0.5}$ varies in a range of $+4.5 \times 10^9$ dyne/cm$^2$ (compressive stress) to $-6 \times 10^9$ dyne/cm$^2$ (tensile stress) from the sputtering gas pressure dependence shown in FIG. 3. Therefore, when the insulating film has a compressive stress of $+2.5 \times 10^9$ dyne/cm$^2$ ($=F_1$) as shown in FIG. 1, a target of $WSi_{0.5}$ is used for sputtering under condition of applied power of 450 W and pressure of 5 m Torr thereby to produce a $WSi_x$ (x=0.5) 3 having compressive stress $F_2$ of $+2.5 \times 10^9$ dyne/cm$^2$.

Figure 5A:
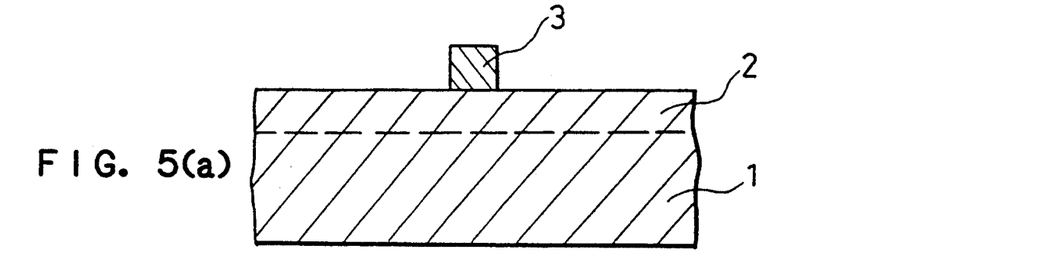
Figure 5B:
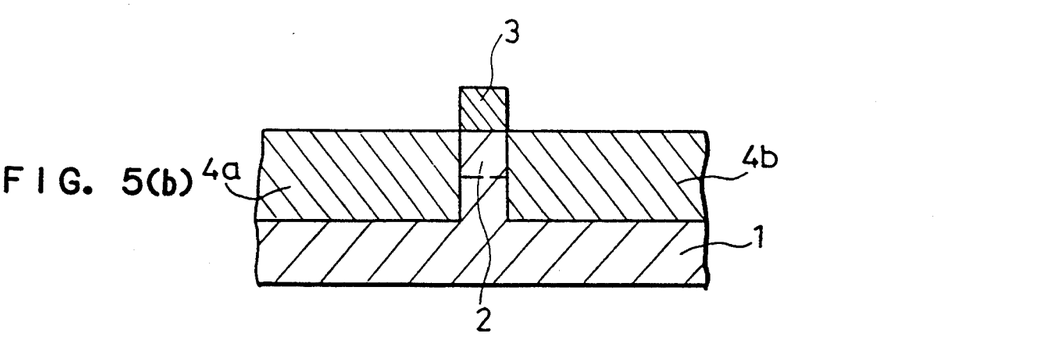
Figures 6A, 6B, 6C:
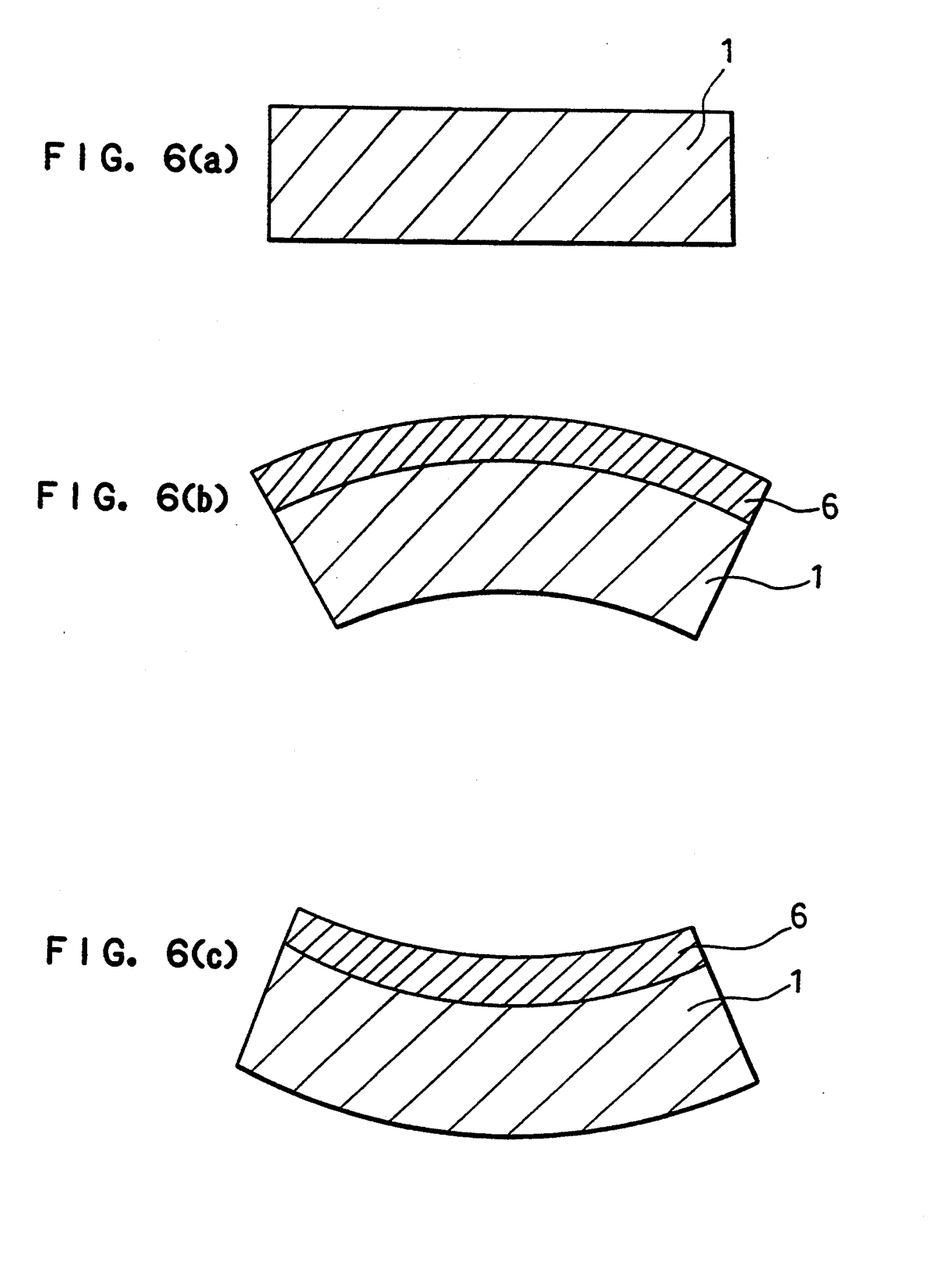
FIGS. 6(a), 6(b), and 6(c) are diagrams explaining a method of measuring the stress in an insulating film.

Next, as shown in FIG. 5(b), ion implantation of Si+ ions into the semi-insulating substrate 1 is conducted at 60 KeV and $1 \times 10^{13}$ cm$^{-2}$, and annealing is conducted to produce high concentration diffusion layers 4a and 4b.

Figure 5C:
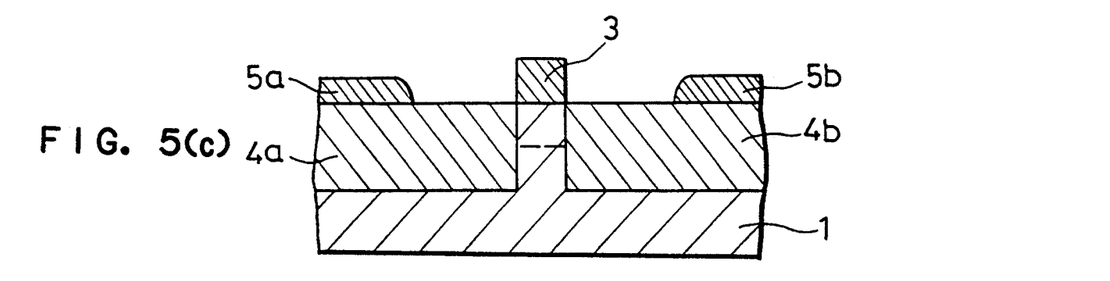
Figure 5D:
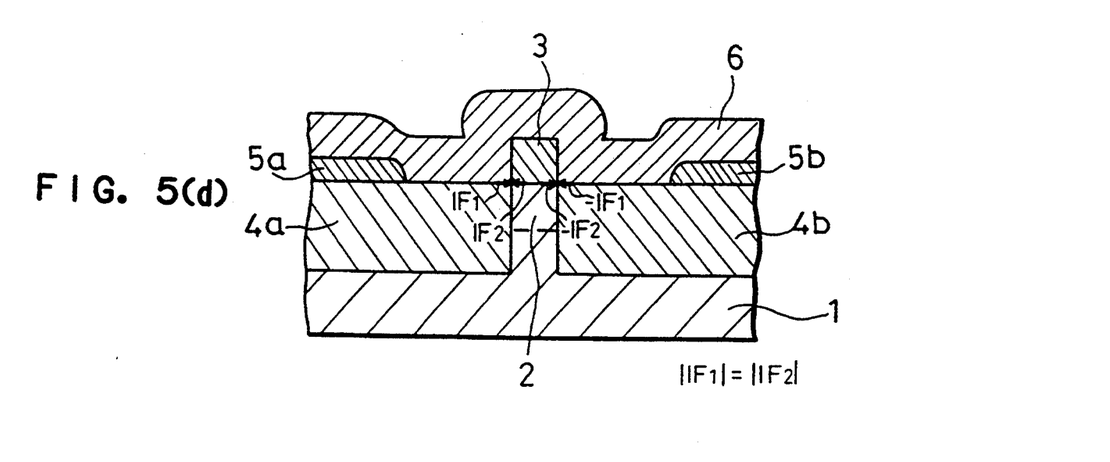

Thereafter, as shown in FIG. 5(c), ohmic electrodes 5a and 5b comprising AuGe/Ni/Au of about 2000 angstroms thickness are deposited on the high concentration diffusion layers 4a and 4b, respectively. As shown in FIG. 5(d), an insulating film comprising SION, SiO$_2$, or SiN (in the embodiment an insulating film having compressive stress of $+2.5 \times 10^9$ dyne/cm$^2$) whose stress is previously measured as described above is deposited on the entire surface of substrate to a thickness of 5000 to 6000 angstroms, thereby completing the device of the embodiment.

Figure 2:
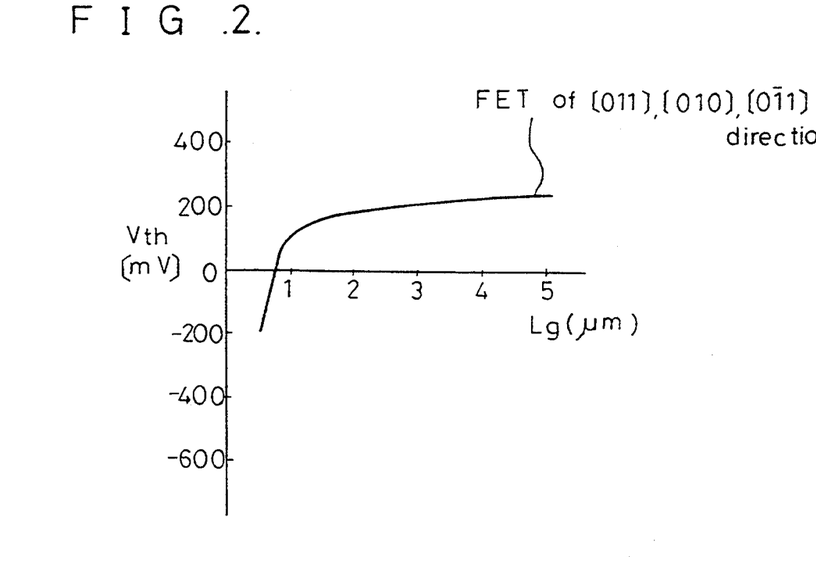
FIG. 2 is a diagram showing the gate direction dependence of the short channel effect of a semiconductor device according to the embodiment of the present invention.

In the production method for this embodiment, the stress of the $WSi_x$ 3 is adjusted by controlling the sputtering gas pressure, and both the vector stress $F_2$ of the $WSi_x$ 3 and the vector stress $F_1$ of the insulating film 6 concentrated at the end of gate electrode are in a relationship that the vector sum of them is equal to zero. A field effect transistor having no gate direction dependence in the short channel effect is obtained as shown in FIG. 2.

Figure 4A:
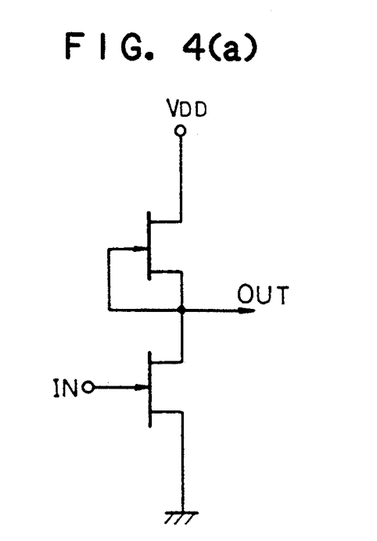
Figure 4B:
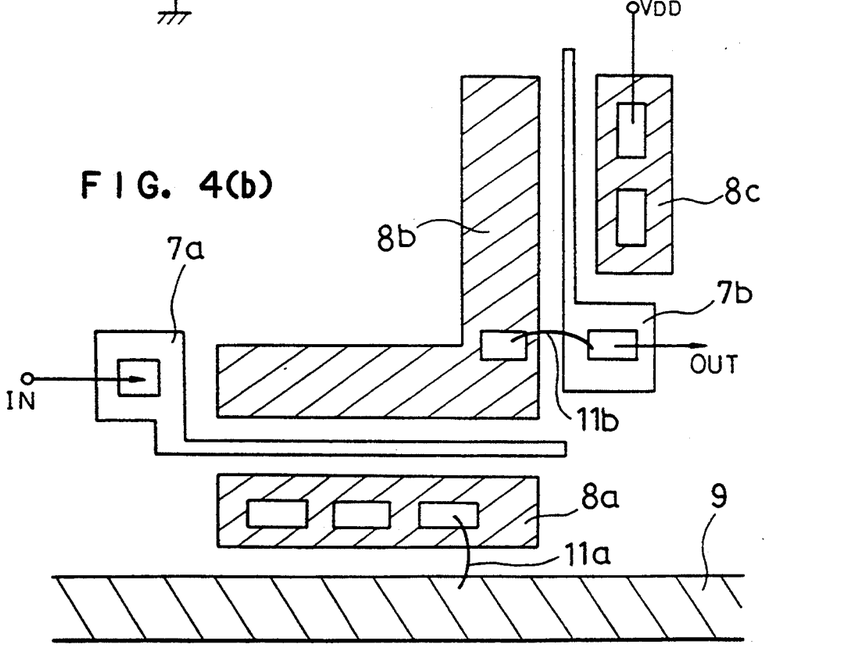

FIG. 4(b) shows an example of a pattern diagram of the embodiment of the present invention in which the circuit of FIG. 4(a) includes an integrated circuit utilizing this field effect transistor. In the figure, the same reference numerals designate the same elements as those shown in FIG. 9(b). When the DCFL circuit of FIG. 4(a) is patterned using the FET as described above, because there is no gate direction dependence in the short channel effect of FET, the gate direction can be arbitrarily selected. For example, the gate electrode 7a and the gate electrode 7b can be arranged colinearly with each other as shown in FIG. 4(b).

In the semiconductor device according to the present invention, both the stress of the gate metal and the insulating film concentrated at the end of the gate electrode cancel so that the vector sum of them is equal to zero. The short channel effect of the FET can be suppressed and no gate direction dependence is observed. When producing an integrated circuit, the degree of freedom of the pattern arrangement can be greatly enhanced, thereby easing the integration to a great extent.

In the above-illustrated embodiment, a GaAs substrate 1 is used for the compound semiconductor, but the other III-V group compound semiconductor substrates such as InP or InAs can be used. Furthermore, a II-VI group compound semiconductor substrate may be used.

As is evident from the foregoing description, according to the present invention, the stress of the gate metal and the insulating film concentrated at the end portion of the gate electrode are in a relationship that the vector sum of them is equal to zero, and the short channel effect of field effect transistor can be suppressed and the variation in the threshold voltage can be reduced. In patterning an integrated circuit, no gate direction dependence is observed, and an arbitrary gate direction can be employed, thereby enhancing the degree of design and enabling the scale-down of chip area.

What is claimed is:

1. A field effect transistor having a gate threshold voltage comprising a compound semiconductor substrate having a (100) crystalline surface, a linear metal gate electrode having a gate length less than two microns disposed on said surface and having an internal stress, and an electrically insulating film disposed on said surface covering said gate electrode which applies a stress to said gate electrode wherein the vector sum of the internal stress within the metal gate electrode and the stress applied by said electrically insulating film to said gate electrode is substantially zero and the threshold voltage is independent of gate orientation on said surface of said substrate.

2. The field effect transistor as defined in claim 1 wherein said compound semiconductor substrate is one of a III-V group compound semiconductor and a II-VI group compound semiconductor.

3. The field effect transistor as defined in claim 1 wherein said compound semiconductor substrate is semi-insulating GaAs.

4. The field effect transistor as defined in claim 3 wherein said gate electrode is $WSi_x$.

5. A semiconductor device comprising:
a compound semiconductor substrate having a (100) crystalline surface;
at least two field effect transistors disposed on said surface and in said substrate, each of said field effect transistors having a respective gate threshold voltage and a respective linear metal gate electrode disposed on said surface, having an internal stress, and a gate length less than two microns, said linear gates lying on said surface along intersecting lines; and
an insulating film disposed on said surface and covering said gate electrodes which applies a stress to each of said gate electrodes wherein the vector sum of the internal stress within each of said metal gate electrodes and the stress applied by said insulating film to the respective gate electrodes is substantially zero and the threshold voltages of said field effect transistors are substantially equal.

* * * * *